(12) United States Patent
Gruber et al.

(10) Patent No.: US 7,619,252 B2
(45) Date of Patent: Nov. 17, 2009

(54) INTEGRATED CIRCUIT HAVING A PREDEFINED DIELECTRIC STRENGTH

(75) Inventors: Berthold Gruber, Bad Rappenau (DE); Lars Hehn, Heilbronn (DE)

(73) Assignee: Atmel Automotive GmbH, Heilbronn (DE)

( * ) Notice: Subject to any disclaimer, the term of this patent is extended or adjusted under 35 U.S.C. 154(b) by 518 days.

(21) Appl. No.: 11/196,277

(22) Filed: Aug. 4, 2005

(65) Prior Publication Data

US 2006/0028263 A1 Feb. 9, 2006

(30) Foreign Application Priority Data

Aug. 6, 2004 (DE) ............... 10 2004 039 620

(51) Int. Cl.
*H01L 31/112* (2006.01)

(52) U.S. Cl. .......... 257/69; 257/E27.016; 257/E21.435; 327/427; 327/434; 327/502

(58) Field of Classification Search .......... 327/434, 327/436, 437, 502, 427; 257/288, 341, 350, 257/565, 577, 601, E21.435, E27.016
See application file for complete search history.

(56) References Cited

U.S. PATENT DOCUMENTS

| | | | |
|---|---|---|---|
| 3,761,799 A | 9/1973 | Shuey | |
| 4,367,421 A | 1/1983 | Baker | |
| 4,459,498 A | 7/1984 | Stengl et al. | |
| 4,716,304 A | 12/1987 | Fiebig et al. | |
| 4,751,408 A | 6/1988 | Rambert | |
| 5,382,826 A | 1/1995 | Mojaradi et al. | |
| 5,629,542 A * | 5/1997 | Sakamoto et al. | ........... 257/328 |
| 6,320,362 B1 | 11/2001 | Baek et al. | |
| 6,380,793 B1 * | 4/2002 | Bancal et al. | ............... 327/427 |
| 6,429,492 B1 * | 8/2002 | Rockett | ...................... 257/368 |
| 6,836,148 B2 * | 12/2004 | Pullen et al. | .................. 326/81 |

FOREIGN PATENT DOCUMENTS

| | | |
|---|---|---|
| DE | 2 240 538 C3 | 7/1973 |
| DE | 31 00 795 A1 | 8/1982 |
| DE | 35 22 429 A1 | 1/1987 |
| JP | 60-247 325 | 12/1985 |

* cited by examiner

*Primary Examiner*—Khiem D Nguyen
(74) *Attorney, Agent, or Firm*—Muncy, Geissler, Olds & Lowe, PLLC

(57) ABSTRACT

An integrated circuit having a first connection, a second connection, a substrate, and a control connection, in provided. The control connection controls a conductivity of the integrated circuit between the first connection and the second connection. The integrated circuit further includes a first transistor and n additional transistors with conductive paths connected between the first connection and the second connection, n diodes, each of the n diodes being connected between a control connection of the n transistors and a driver supply voltage that corresponds to the voltage at the first connection combined with an additive offset, and wherein the control connection of the integrated circuit connects either the driver supply voltage or the voltage at the first connection to a control connection of the first transistor, and a voltage divider that is connected between the first connection and the second connection in parallel to the conductive paths and that connects the control connections of the transistors to one another and to both the first connection and the second connection. The control connections of each set of two transistors are connected to one another by a subsection of the voltage divider, which lies between them.

9 Claims, 3 Drawing Sheets

INTEGRATED CIRCUIT HAVING A PREDEFINED DIELECTRIC STRENGTH

This nonprovisional application claims priority under 35 U.S.C. § 119(a) on German Patent Application No. DE 102004039620.5, which was filed in Germany on Aug. 6, 2004, and which is herein incorporated by reference.

BACKGROUND OF THE INVENTION

1. Field of the Invention

The present invention relates to an integrated circuit having a first connection, a second connection, a substrate, and a control connection, wherein the control connection controls a conductivity of the integrated circuit between the first and the second connections.

2. Description of the Background Art

Such an integrated circuit can correspond to a transistor. In an implementation of an integrated circuit through an individual field-effect transistor, the first connection is defined by the source connection, the second connection by the drain connection and the control connection by the gate connection of the field-effect transistor. In an implementation as a bipolar transistor, the first connection is, for example, implemented by the emitter, the second connection by the collector and the control connection by the base of the bipolar transistor.

Depending on the application, such an integrated circuit, which has a first connection, a second connection, a substrate, and a control connection, must meet specific requirements for the dielectric strength between the first connection and the second connection, on the one hand, and between the first connection or the second connection and the substrate on the other hand. In this context, the dielectric strengths required within a circuit may be different. In one example application of a circuit to control a bridge circuit made of power transistors, such as is described in greater detail below, voltage differences between the first connection and the substrate result that can have variations on the order of magnitude of −10 to +60 V. In addition, there arise voltages of up to 20 V between the first connection and the second connection of such an integrated circuit, so that a voltage difference from the second connection of the integrated circuit to the substrate of 20 V+60 V=80 V can arise, for example. These requirements for the dielectric strength between the first connection and the second connection, on the one hand, and between the first connection or second connection and the substrate on the other hand, can in principle be met using specially designed individual transistors.

The design and manufacture of individual transistors individually adapted for special requirements in each case is very costly. The alternative of restricting the applications to those which can be implemented by using existing individual transistors as integrated circuits would, however, undesirably limit the number of possible applications.

SUMMARY OF THE INVENTION

It is therefore an object of the present invention to provide an integrated circuit that makes it possible to meet the different requirements of different applications for dielectric strength of a large number of applications using a relatively small number of existing transistor types, each with different characteristics.

This object is attained in an integrated circuit of the aforementioned type, having: a first transistor and n additional transistors with conductive paths connected in series between the first and second connection, wherein n is an integer $\geq 1$, n diodes, wherein each of the n diodes is connected between a control connection of the n transistors and a supply voltage that corresponds to the voltage at the first connection combined with an additive offset, and wherein the control connection of the integrated circuit connects either the supply voltage or the voltage at the first connection to a control connection of the first transistor, and a voltage divider that is connected between the first connection and the second connection in parallel to the conductive paths and that connects the control connections of the transistors to one another and to both the first connection and the second connection, wherein the control connections of each set of two transistors are connected by a subsection of the voltage divider which lies between them.

The object of the invention is attained in full through these features. Specifically, as a result of the conductive paths of several individual transistors connected in series between the first connection and second connection, the result is a dielectric strength between the aforementioned connections that corresponds to the sum of the dielectric strengths of individual transistors used. Then, each one of the individual transistors used need only possess the required dielectric strength with respect to the substrate. The dielectric strength required for the entire integrated circuit between the first and second connections can then be increased as desired by series-connecting several conductive paths in a stepwise manner.

On the one hand, the diodes ensure that the control connections of the transistors can be driven synchronously in the forward direction of the diodes. By this means, the transistors are switched on by activating their conductive paths. On the other hand, in the switched-off state of the transistors, the diodes allow different gate voltages to arise at the different transistors without mutual interaction through a common control connection. In this context, the transistors are switched off by applying the voltage of the first connection to the control connection of the first transistor, and are switched on by applying the supply voltage to this control connection.

In the switched-off state, it is necessary to ensure that the voltage across the conductive path of each of the individual transistors does not exceed a maximum permissible value. This is accomplished with the aid of a voltage divider, which uniformly divides the voltage between the first connection and the second connection of the integrated circuit among the n transistors.

One embodiment of the invention is characterized in that the voltage divider has a diode connected between the second connection of the integrated circuit and the control connection of the transistor whose conductive path is likewise connected to the second connection of the integrated circuit.

As a result of the directional blocking action of this diode, a higher voltage can be established at the control connection of this transistor than is present at the second connection of the integrated circuit. In this way, this transistor can be switched on independent of the voltage at the second connection of the integrated circuit.

Another embodiment has a series connection of n Zener diodes, each of which is connected in parallel to one of the subsections of the voltage divider connecting the control connections of the transistors to one another.

In the event of an overvoltage, which can arise, for example, as a result of an electrostatic discharge between the first and the second connections of the integrated circuit, these Zener diodes open a current path that bridges the subsections of the voltage divider so that uniform turn-on voltages appear at the control connections of the transistors.

A resistor can be arranged between the control connection of the integrated circuit and the control connection of the first transistor. In the event of an overvoltage with conducting Zener diodes, this resistor provides for a voltage difference between the control connection of the first transistor and the control connection of the integrated circuit. This ensures that even the first transistor is driven into conduction in the event of an overvoltage. As a result of driving the transistors into conduction, a continuous conductive path is provided between the first and second connections of the integrated circuit, through which path the overvoltage can be dissipated.

The transistors can also be implemented as MOS field-effect transistors.

In contrast to bipolar transistors, such MOS field-effect transistors can be driven capacitively and thus with almost no current, which reduces the power consumption of the integrated circuit. In such an implementation, the gate connections of the field-effect transistors serve as control connections. The source connections of the field-effect transistors are oriented toward the first connection of the integrated circuit, and the drain connections are oriented toward the second connection of the integrated circuit. However, it is a matter of course that, in principle, the integrated circuit can also be implemented with bipolar transistors.

Also, the integrated circuit can be implemented with CMOS technology.

In the field of CMOS technology, it is known that N-channel and P-channel field-effect transistors can be created on the same substrate. Since N-channel and P-channel field-effect transistors react in opposite ways to the same control signals, switch-on processes and switch-off processes can be controlled at the same time with one control signal.

Another embodiment includes a circuit section that passes a variable voltage to the first connection.

This circuit section can, for example, be the lower part of a half-bridge, which is connected to a low supply voltage, while the integrated circuit is located between the first connection and a high supply voltage. Depending on whether the integrated circuit or the circuit section is driven into conduction, either the low supply voltage or the high supply voltage results at the connection point of the circuit section to the integrated circuit, and thus at the first connection. In this way a load, for example, connected to the connection point can be controlled.

Another embodiment includes a first power transistor whose conductive path lies between the first connection and a current source and is controlled by the second connection.

Within the scope of this embodiment, the integrated circuit is used to switch off the aforementioned power transistor. When the conductive paths of the integrated circuit are cut off, a voltage difference between the gate and source of the power transistor can be established by additional circuit sections. In contrast, when the conductive paths of the integrated circuit are driven into the conducting state, the result is equal voltages at the gate and source of the power transistor, by which means it is driven into a cut-off state.

The circuit can have an additional power transistor whose conductive path lies in series with the conductive path of the first power transistor between the current source and a reference voltage of the circuit.

The additional power transistor is preferably driven into conduction or cut-off in alternation with the first power transistor, so that the voltage of the current source or the reference voltage alternately appear at the connection point of the two transistors. In this way, a load connected to the connection point can alternately be supplied with the two voltages.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
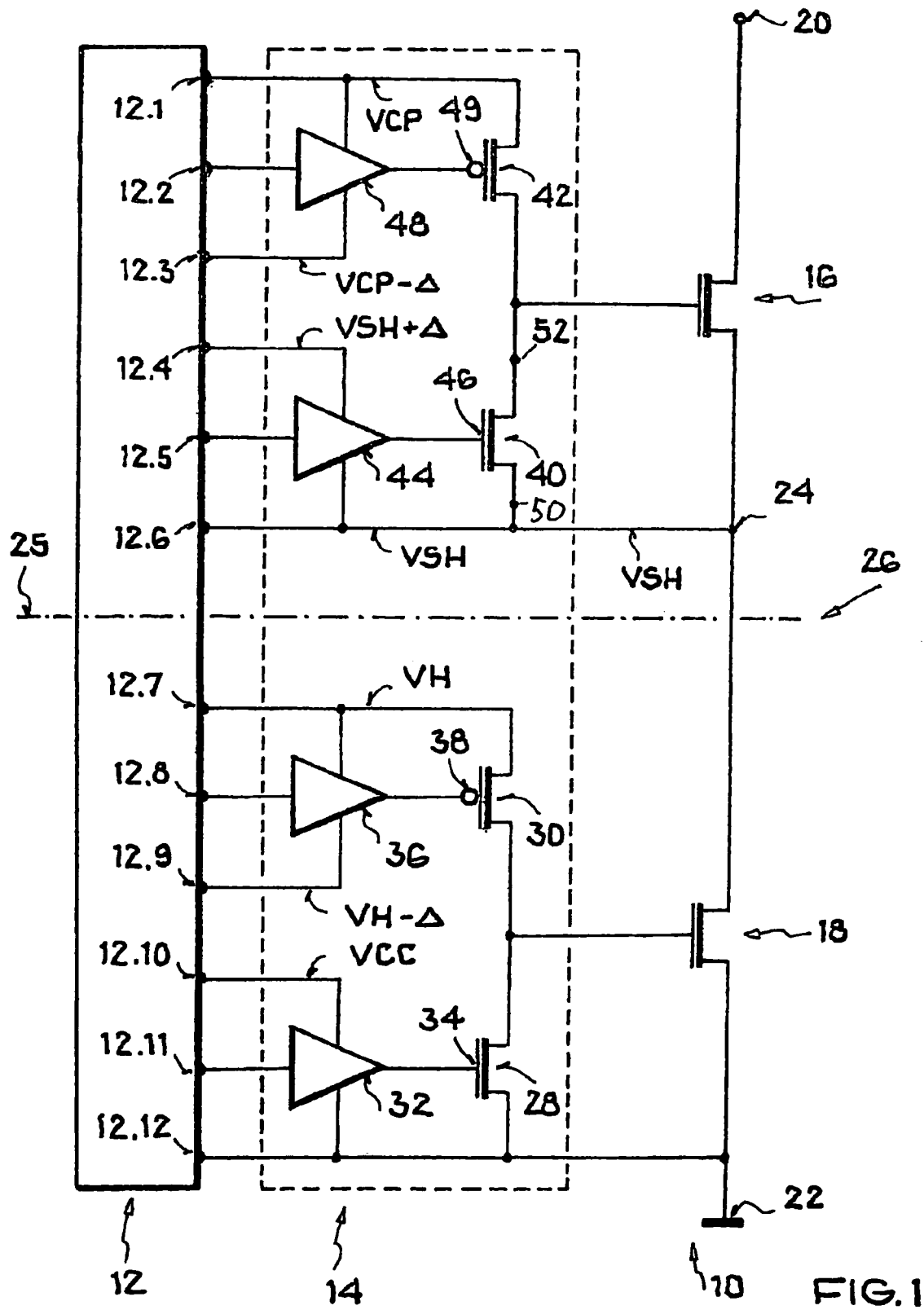
FIG. 1 illustrates a half-bridge as an example of a technical environment of the invention.

FIG. 1 shows a half-bridge 10 that is controlled by a control logic unit 12 through a driver circuit 14. The half-bridge 10 has a first power transistor 16 and a second power transistor 18, which are wired in series between a power supply voltage connection 20 and a reference voltage connection 22. The control logic unit 12 switches on either the first power transistor 16 or the second power transistor 18 via the driver circuit 14. To this end the control logic unit 12 has outputs 12.1 to 12.12, which output supply voltages and/or control signals. When the first power transistor 16 is switched on, the second power transistor 18 is switched off, and vice versa. Thus, the reference voltage from connection 22 is present at a first connection 24 located between the two power transistors 16, 18 when the second power transistor 18 is switched on, and when the first power transistor 16 is switched on, the power supply voltage from connection 20 is present at the first connection 24.

The part of the circuit in FIG. 1 below the first connection 24 and the line 25, with the second power transistor 18 and the associated part of the driver circuit 14, thus constitutes a circuit section 26 that passes a variable voltage to the first connection 24. The second power transistor 18 is controlled by two complementary field-effect transistors 28 and 30 which are located in series between the reference voltage connection 22 and a supply voltage VH that is output by the output 12.7 of the control logic unit 12. In FIG. 1, the lower transistor 28 is implemented as an N-channel field-effect transistor (NMOS-FET), and the upper transistor 30 is implemented as a P-channel field-effect transistor (PMOS-FET). A driver 32 controls a control connection 34 of the NMOS-FET 28 as a function of commands from the control logic unit 12 that are output through the output 12.11. The driver 32 connects either the reference voltage present at the output 12.12 or a voltage VCC output from the output 12.10 to the control connection 34, where VCC is positive with respect to the reference voltage and switches the NMOS-FET 28 on.

In similar fashion, the PMOS-FET 30 is driven by the driver 36, which connects either a switch-off voltage VH from output 12.7 or a switch-on voltage $V\_H-\Delta$ from output 12.9 to a control connection 38 of the PMOS-FET 30. The value of $\Delta$ can be 5V, for example. In this regard, the voltages VCC and VH are referenced to the constant reference voltage at connection 22 of the arrangement, which also corresponds to the substrate voltage of the transistors 28, 30. VCC and VH can typically be on the order of magnitude of approximately 10 V, so that no high requirements are placed on the dielectric strength of the transistors 28, 30.

In contrast, significantly higher requirements arise for the dielectric strength of the transistors 40 and 42 which control the first power transistor 16. In an integration of the circuit from FIG. 1 on a chip, the substrate voltage of these two transistors 40, 42 corresponds to the reference voltage at connection 22 and is thus at a constant, low value. In contrast, the other voltages at connections of the transistors 40, 42 depend on which of the two power transistors 16 and 18 is switched on. When the second power transistor 18 is switched on and the first power transistor 16 is switched off, the reference voltage appears at the first connection 24 of the circuit. However, if only the first power transistor 16 is switched on, the power supply voltage 20 appears at the first connection 24. All voltages that appear at the connections of the transistors 40, 42 are based on the voltage that appears at the first connection 24. This greatly increases the voltage differences to the substrate voltage in particular.

The driver 44 which controls the NMOS transistor 40 connects to the control connection 46 either the switch-off voltage VSH from the first connection 24 or a switch-on voltage VSH+Δ that is positive with respect to VSH. Here, too, Δ can have a value of, for example, 5 V. VSH is also present at connection 12.6, while VSH+Δ is output by output 12.4, and the driver control signal is output by connection 12.5.

Similarly, the driver 48 that is controlled by the output 12.2 and controls the PMOS-transistor 42, connects to the control connection 49 of said transistor either a switch-off voltage VCP from output 12.1, or a switch-on voltage VCP-Δ from output 12.3. In this regard, VCP is, for example, 10 V more positive than VSH, and VCP-Δ is approximately 5 V more negative than VCP.

The first power transistor 16 is switched on through the transistor 42, and through the transistor 40 the first power transistor 16 is switched off by short-circuiting its source connection 50 and its gate connection 52. The voltage VSH is present at the first connection 50 (source) of the transistor 40, and the voltage VCP, which exceeds the value of VCH, is present at the second connection 52 (drain). The difference between VSH and VCP can be up to 20 V, for example, so that the transistor 40 must correspondingly be able to block up to 20 V between its first and second connections, which is to say between source 50 and drain 52. When the first power transistor 16 is switched on, VSH corresponds to the power supply voltage of connection 20, which has a value of 50-60 V for example; as a result, the transistor 40 must correspondingly be able to block up to 80 V between drain 52 and the substrate with the values specified.

Figure 2:
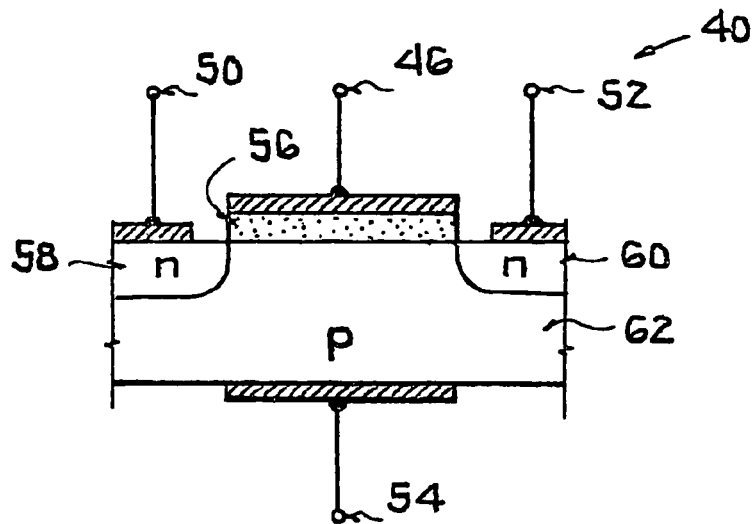
FIG. 2 is a cross-section through a MOS transistor to clarify the requirements for dielectric strength.

To illustrate these requirements for dielectric strength, FIG. 2 schematically shows a cross-section through an N-channel MOSFET 40. The MOSFET 40 has a substrate connection 54, a source connection 50, a drain connection 52, and a gate connection 46 above a gate oxide 56. In the example shown, when an adequately positive gate voltage is present, an n-conducting channel forms between n-doped source area 58 and drain area 60 in a p-conducting substrate. As described in connection with FIG. 1, the transistor 40 must be able to block a voltage of 20 V between drain and source and a voltage of approximately 80 V between drain and substrate under the conditions cited as an example.

As mentioned above, it is sometimes the case in circuit development that requirements for dielectric strength simply cannot be met with existing components. Under the boundary conditions given as an example in conjunction with FIG. 1, for example, an N-channel transistor 40 is required that can block 80 V to the substrate and whose maximum drain-source voltage must be greater than 20 V.

The way in which these requirements can be met using other transistors when such an individual transistor is not available is shown below.

Figure 3:
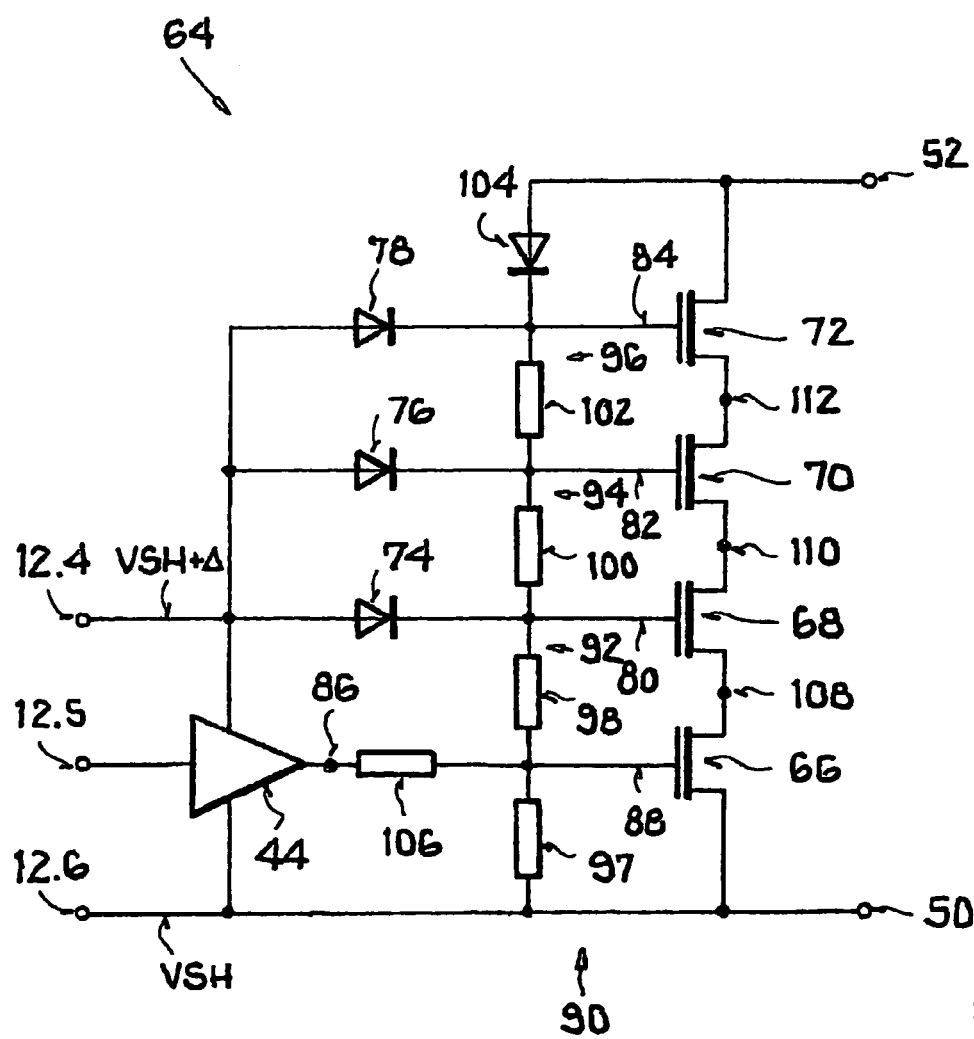
FIG. 3 is a first example embodiment of the invention with example values of voltages that occur in the switched-on state of the integrated circuit.

FIG. 3 shows an example embodiment of an integrated circuit 64 according to the invention, which can replace the individual transistor 40 from FIG. 1 because it has the required dielectric strength between first connection 50 and second connection 52, and between first or second connection 50, 52 and the substrate 62.

The integrated circuit 64 has a first transistor 66 and n=3 additional transistors 68, 70 and 72, whose conductive paths are arranged in series between the first connection 50 and the second connection 52 of the integrated circuit 64. The number n of additional transistors is not fixed at the example of three additional transistors 68, 70 and 72 as shown, but instead can be any integer greater than or equal to 1. In addition, the integrated circuit 64 has n diodes 74, 76 and 78, each of which is arranged between a control connection 80, 82, 84 of the n transistors 68, 70, 72 and a driver supply voltage VSH+Δ. The driver supply voltage corresponds to the voltage VSH combined with an additive offset Δ at the first connection 50 from FIG. 1 such as is provided in FIG. 1 by connection 12.4 of the control logic unit 12. A control connection 86 of the integrated circuit 74 passes either the driver supply voltage VSH+Δ or the voltage VSH at the first connection 50 to a control connection 88 of the first transistor 66. The integrated circuit 64 also has a voltage divider 90 that is arranged in parallel to the conductive paths of the transistors 66, 68, 70 and 72 between the first connection 50 and the second connection 52 and that connects the control connections 80, 82, 84, 88 of the additional transistors 68, 70, 72 and the first transistor 66 to one another and to the first connection 50 and the second connection 52. In this regard, the control connections 80, 82, 84, 88 of each set of two of the transistors 68, 70, 72, 66 are connected to one another by a subsection 92, 94, 96 which lies between them. Each subsection 92, 94, 96 has an ohmic resistor 98, 100, 102, for example. A resistor 97 as part of the voltage divider 90 provides a connection to the first connection 50.

The voltage divider 90 uniformly divides the voltage between the first connection and the second connection of the integrated circuit among the n transistors 66, 68, 70, 72. As a desirable consequence, the voltage across the conductive paths of each individual transistor 66, 68, 70, 72 in the switched-off state of the circuit 64 does not exceed a permissible maximum value.

The voltage divider 90 optionally has an additional diode 104 connected between the second connection 54 and the control connection 84 of the transistor 72 whose conductive path is likewise connected to the second connection 52.

As a result of the directional blocking action of this diode 104, a higher voltage can be established at the control connection 84 of this transistor 72 than is present at the second connection 52 of the integrated circuit 64. In this way, the transistor 72 can be switched on independent of the voltage at the second connection 52 of the integrated circuit 64.

In addition, the circuit 64 optionally has a decoupling resistor 106 arranged between the control connection 86 and the control connection 88 of the first transistor. In the event of an overvoltage, this resistor 106 provides for a voltage difference between the control connection 88 of the first transistor 66 and the control connection 86 of the integrated circuit 64. This ensures that even the first transistor 66 is driven into conduction in the event of an overvoltage. As a result of driving the transistors 66, 68, 70, 72 into conduction, a continuous conductive path is provided between the first connection 50 and the second connection 52 of the integrated circuit 64, through which path the overvoltage can be dissipated.

The circuit 64 can be switched between two states as a function of the voltage at the control input 86. In a first state, the driver 44 delivers the voltage VSH to the control connection 86. The same voltage VSH then appears at the control connection 88 of the first transistor 66 as at the first connection 50 and thus the source connection of the first transistor 66. As a result, the first transistor 66 does not form a conductive channel, so the conductive path of the first transistor 66, and thus the conductive paths of the other transistors 68, 70, 72 as well, are interrupted. For an application of the integrated circuit 64 in place of the transistor 40 in FIG. 1, when an interrupted conductive path is present, the power supply voltage from connection 20 is present at the source connection 50, and a voltage VCP that is for example 16 V higher appears at the drain connection 52. This voltage difference of 16 V is uniformly distributed over the control connections 88, 80, 82 and 84 by the voltage divider 90, so that a voltage of 0 V appears at control connection 88, a voltage of approximately 5 V at control connection 80, a voltage of approximately 10 V at control connection 82, and a voltage of approximately 15 V at control connection 84. Approximately 1 V drops across the diode 104.

Similar voltages then appear at the source connections 108, 110, 112, so on the order of 5V is present at the source connection 100, approximately 10 V at the source connection 110, and approximately 15 V at the source connection. In other words, the voltage difference of, for example, 16V appearing between the connections 50 and 52 of the integrated circuit 64 is distributed among transistors 66, 68, 70, 72. Each one of the transistors 66, 68, 70, 72 need therefore only have a fraction of the dielectric strength that a single transistor 40 would need in order to be usable in the circuit arrangement in FIG. 1. There are no differences in the requirements for dielectric strength between drain and substrate between the transistors 66, 68, 70, 72 on the one hand and the single transistor 40 on the other hand.

The diodes 74, 76, 78 prevent mutual interaction among different voltages at the control connections 80, 82, 84.

In order to switch on a conductive connection between connections 50 and 52 of the integrated circuit 64, the output of driver 44 is switched by the connection 12.5 from the voltage VSH to the voltage VSH+Δ, so that the transistor 66 (in an embodiment as NMOS) conducts. As a result, the voltage at connection 108 drops, so that the control connection of the transistor 68 becomes positive with respect to its source connection 108. The positive voltage at the control connection 88 switches the transistor 68 on. The transistors 70 and 72 are switched on in a similar fashion, so that a continuous conductive path arises between the connections 50 and 52 through the transistors 66, 68, 70, and 72.

Figure 4:
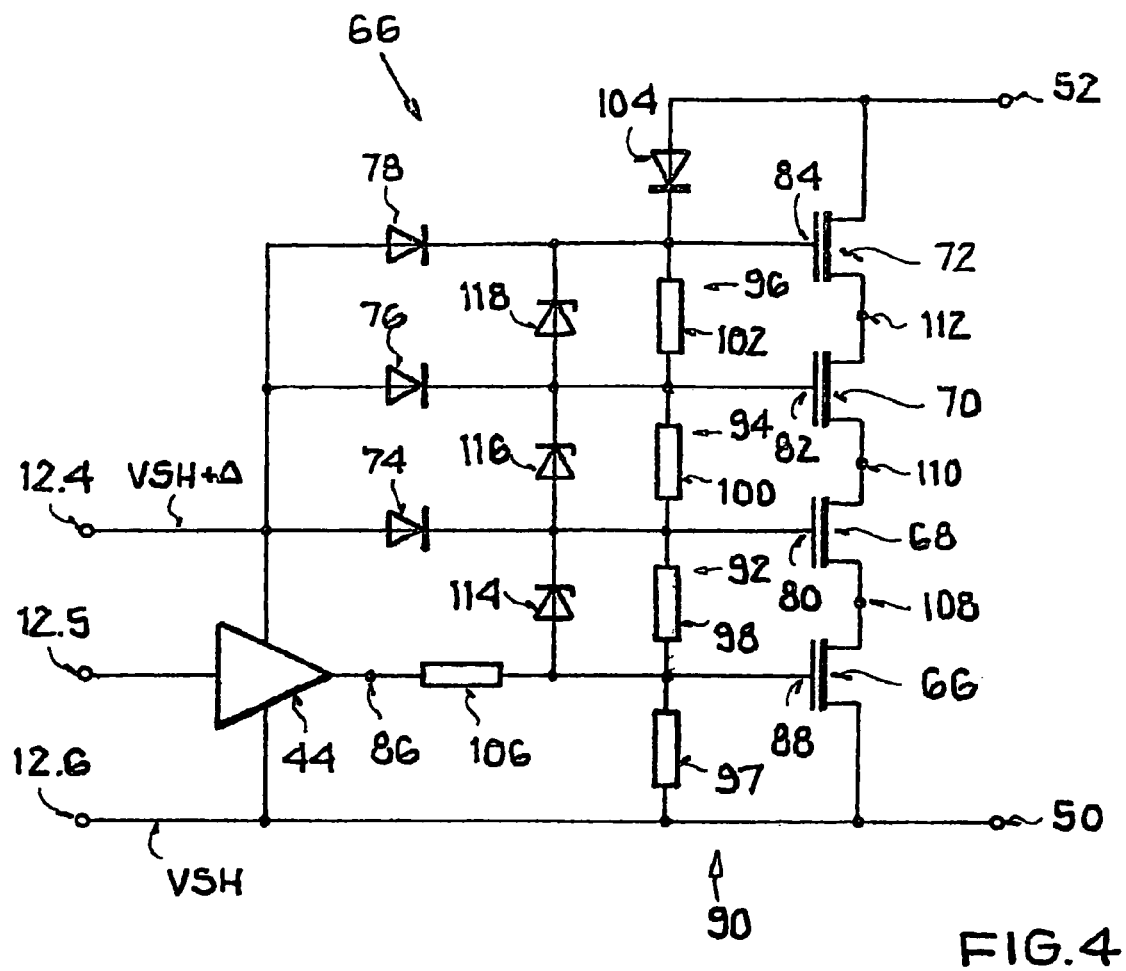
FIG. 4 is another example embodiment of the invention with example values of voltages that occur in the switched-off state of the integrated circuit.

FIG. 4 shows an integrated circuit 66 that is distinguished from the integrated circuit 64 in FIG. 3 by an additional series connection of n=3 Zener diodes 114, 116, 118. Each of the Zener diodes 114, 116, 118 is connected in parallel with one of the subsections 92, 94, 96 of the voltage divider 90 which together control connections 88, 80, 82, 84 of the transistors 66, 68, 70, 72.

In the event of an overvoltage, which can arise, for example, as a result of an electrostatic discharge between the first connection 50 and the second connection 52 of the integrated circuit 66, these Zener diodes 114, 116, 118 open a current path that bridges the subsections 92, 94, 96 of the voltage divider 90 so that uniform turn-on voltages appear at the control connections 88, 80, 82, 84 of the transistors 66, 68, 70, 72.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. An Integrated circuit comprising:
a first connection;
a second connection;
a substrate; and
a main control connection for controlling a conductivity of the integrated circuit between the first connection and the second connection;
a first transistor and n additional transistors having conductive paths connected in series between the first connection and the second connection, wherein n is an integer greater than or equal to 1, each of said transistor and said n additional transistors having a transistor control connection;
n diodes, each of the n diodes being connected between a transistor control connection of the n transistors and a driver supply voltage that corresponds to a voltage at the first connection combined with an additive offset, the main control connection connecting either the driver supply voltage or the voltage at the first connection to a control connection of the first transistor; and
a voltage divider connected between the first connection and the second connection and in parallel to the conductive paths, the voltage divider connecting the transistor control connections of the n transistors and the transistor control connection of the first transistor to one another and to both the first connection and the second connection,
wherein the control connections of each set of two transistors are connected to one another by a subsection of the voltage divider which lies between them.

2. The integrated circuit according to claim 1, wherein the voltage divider has a diode connected between the second connection and the control connection of the n transistor whose conductive path is connected to the second connection.

3. The integrated circuit according to claim 1, further comprising a series connection of n Zener diodes, each of which is connected in parallel to one of the subsections of the voltage divider connecting the transistor control connections of the transistors to one another.

4. The integrated circuit according to claim 1, wherein a resistor is provided between the control connection of the integrated circuit and the control connection of the first transistor.

5. The integrated circuit according to claim 1, wherein the transistors are MOS field-effect transistors.

6. The integrated circuit according to claim 1, wherein the integrated circuit is based on CMOS technology.

7. The integrated circuit according to claim 1, wherein a circuit section passes a variable voltage to the first connection.

8. The integrated circuit according to claim 1, wherein a first power transistor has a conductive path between the first connection and a power supply voltage connection and is controlled by the second connection.

9. The integrated circuit according to claim 1, wherein an additional power transistor has a conductive path in series with the conductive path of the first power transistor between the power supply voltage connection and a reference voltage connection of the integrated circuit.

* * * * *